United States Patent
Han et al.

(10) Patent No.: US 12,381,126 B1
(45) Date of Patent: Aug. 5, 2025

(54) SILICON CARBIDE COPPER-PLATED GOLD-TIN-PRESET HEAT SINK STRUCTURE AND FABRICATION METHOD THEREOF

(71) Applicant: SHENZHEN HONGHAI TECHNOLOGY CO., LTD., Guangdong (CN)

(72) Inventors: Jiandong Han, Guangdong (CN); Hong Chen, Guangdong (CN); Shuo Yang, Guangdong (CN)

(73) Assignee: SHENZHEN HONGHAI TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 18/885,810

(22) Filed: Sep. 16, 2024

(30) Foreign Application Priority Data

Feb. 1, 2024 (CN) .......................... 202410158337.9

(51) Int. Cl.
  *H01L 23/373* (2006.01)
  *C23C 28/02* (2006.01)

(52) U.S. Cl.
  CPC ........ *H01L 23/3736* (2013.01); *C23C 28/021* (2013.01); *H01L 23/3738* (2013.01)

(58) Field of Classification Search
  CPC ............... H01L 23/562; H01L 23/3736; H01L 23/3738; H01L 23/3735; H01L 23/373; H01L 23/36; C23C 28/021
  See application file for complete search history.

(56) References Cited

U.S. PATENT DOCUMENTS

| | | | |
|---|---|---|---|
| 2012/0257647 A1* | 10/2012 | Shu | H01S 5/041 |
| | | | 372/36 |
| 2018/0019175 A1* | 1/2018 | Appelt | H01L 24/24 |

FOREIGN PATENT DOCUMENTS

| | | | | |
|---|---|---|---|---|
| CN | 118630123 A | * | 9/2024 | ......... H01L 21/4853 |
| JP | 2022163245 A | * | 10/2022 | |

* cited by examiner

*Primary Examiner* — Harry E Arant
(74) *Attorney, Agent, or Firm* — Cooper Legal Group, LLC

(57) ABSTRACT

Disclosed is a silicon carbide copper-plated gold-tin-preset heat sink structure, including a silicon carbide substrate, a first copper plate, a second copper plate and a preset gold-tin layer, wherein the first copper plate is provided on a side of the silicon carbide substrate, the second copper plate is provided on an other side of the silicon carbide substrate, a thickness of the silicon carbide substrate is larger than thicknesses of the first copper plate and the second copper plate, a width of the silicon carbide substrate is larger than widths of the first copper plate and the second copper plate, the thickness of the first copper plate is the same as the thickness of the second copper plate, the width of the first copper plate is smaller than the width of the second copper plate, and the preset gold-tin layer is provided outside the second copper plate.

11 Claims, 2 Drawing Sheets

SILICON CARBIDE COPPER-PLATED GOLD-TIN-PRESET HEAT SINK STRUCTURE AND FABRICATION METHOD THEREOF

CROSS-REFERENCE TO RELATED APPLICATION

The present application claims the priority benefits of China patent application No. 202410158337.9, filed on Feb. 1, 2024. The entirety of China patent application No. 202410158337.9 is hereby incorporated by reference herein and made a part of this specification.

FIELD OF THE INVENTION

The present application relates to the field of laser chip heat dissipation technologies, and in particular, to a silicon carbide copper-plated gold-tin-preset heat sink structure and a fabrication method thereof.

BACKGROUND OF THE INVENTION

Currently, heat dissipation solutions of aluminum oxide or aluminum nitride copper-clad heat sinks (by direct bonding copper (DBC)) are adopted in most of heat dissipation modules of power devices, such as IGBT modules, high-power LEDs, semiconductor laser pumping sources, or the like, in motor inverters of new energy vehicles in China. In a DBC technology, a high temperature is required to sinter copper foil on a surface of a substrate, and then, a required circuit pattern is etched using a wet method. The high temperature during sintering in the process reduces a performance of a material, and when thick copper is etched using the wet method, a bottom of a copper layer is excessively corroded by etching liquid in a long-time etching process, and heat dissipation is adversely affected when a side surface of the copper is not vertical. Therefore, due to bottlenecks present in heat conduction and reliability in this way, this heat dissipation solution is unsuitable for new semiconductor materials.

In an aluminum nitride copper-clad gold-tin-preset heat sink structure at the present stage, heat dissipation and heat matching are realized by aluminum nitride double-sided copper clad, and gold-tin presetting improves an assembly efficiency of chip welding. However, since heat conductivity of aluminum nitride is only 200 W/(m·K), and heat conductivity of copper is 399 W/(m·K), the aluminum nitride copper-clad gold-tin-preset heat sink structure can meet a basic assembling requirement when power of a laser chip is only 5 W to 20 W, but as the power of the laser chip is increased gradually, for example, the power of a single chip is increased to be more than 30 W to 45 W, a higher heat dissipation efficiency is required, otherwise, the laser chip is prone to fail due to poor heat dissipation during operation.

SUMMARY

The present application provides a silicon carbide copper-plated gold-tin-preset heat sink structure and a fabrication method thereof, so as to solve the technical problem in the background that the power of the laser chip is increased gradually, and aluminum nitride double-sided copper clad has poor heat dissipation, resulting in failure of the laser chip.

In order to solve the above technical problem, the following technical solution is adopted in the present application. There are provided a silicon carbide copper-plated gold-tin-preset heat sink structure and a fabrication method thereof, and the silicon carbide copper-plated gold-tin-preset heat sink structure includes a silicon carbide substrate, a first electroplated copper layer, a second electroplated copper layer and a preset gold-tin layer, wherein the first electroplated copper layer is provided on a back side of the silicon carbide substrate, the second electroplated copper layer is provided on a front side of the silicon carbide substrate, a thickness of the silicon carbide substrate is larger than thicknesses of the first electroplated copper layer and the second electroplated copper layer, a width of the silicon carbide substrate is larger than widths of the first electroplated copper layer and the second electroplated copper layer, the thickness of the first electroplated copper layer is the same as the thickness of the second electroplated copper layer, the width of the first electroplated copper layer is smaller than the width of the second electroplated copper layer, the preset gold-tin layer is provided on an outer side of the second electroplated copper layer, and a width of the preset gold-tin layer is the same as the width of the second electroplated copper layer.

By adopting the above technical solution, the copper layers are electroplated on surfaces of two sides of a ceramic substrate to form a copper-silicon carbide-copper structure, the ceramic substrate is the silicon carbide substrate, silicon carbide is a third-generation semiconductor material and has high temperature resistance, corrosion resistance, high stability and high heat conductivity, the heat conductivity of the silicon carbide is larger than 390 W/(m·K) and quite close to heat conductivity (about 397 W/(m·K)) of copper, and a good heat conduction effect is achieved; the width of the first electroplated copper layer is smaller than the width of the second electroplated copper layer, such that scattering of emitted light is not affected when the chip is made at an edge of the second electroplated copper layer, thus guaranteeing the power of the chip; the silicon carbide gold-tin-preset heat sink is obtained to meet requirements of the high-power laser chip for heat dissipation and assembly welding technologies of the heat sink.

Optionally, the silicon carbide copper-plated gold-tin-preset heat sink structure includes seed layers, the seed layers are provided on the front side and the back side of the silicon carbide substrate, the seed layers are provided between the first electroplated copper layer and the silicon carbide substrate and between the second electroplated copper layer and the silicon carbide substrate respectively, and the seed layers have a titanium copper or titanium tungsten alloy copper metallization layer structure.

By adopting the above technical solution, the seed layers are provided on the two sides of the silicon carbide substrate, such that the first electroplated copper layer and the second electroplated copper layer can be electroplated onto the silicon carbide substrate, and a bearing transition effect is achieved; titanium copper or titanium tungsten alloy copper metallization layers are attached to the front side and the back side of the silicon carbide substrate and combined with the first electroplated copper layer and the second electroplated copper layer, such that the copper can be conveniently plated on the silicon carbide substrate; titanium or titanium tungsten alloy has high strength, corrosion resistance and high temperature stability, such that an overall structure is stable.

Optionally, an alloy proportion of the preset gold-tin layer is Au (77±3%) Sn or Au (75±5%) Sn.

By adopting the above technical solution, a whole heat dissipation effect is good, and the requirements of the high-power laser chip for the heat dissipation and assembly welding technologies of the heat sink are met.

Optionally, the thickness of the silicon carbide substrate is 0.3 mm to 0.6 mm, and the thicknesses of the first electroplated copper layer and the second electroplated copper layer are 0.002 mm to 0.09 mm.

By adopting the above technical solution, the overall structure is stable, the heat conduction effect is good, and heat dissipation of the chip is facilitated.

Optionally, a circuit layer is provided on the second electroplated copper layer.

By adopting the above technical solution, the circuit layer is connected with the second electroplated copper layer and the chip, such that the chip is electrically connected with a copper plate.

A fabrication method of the silicon carbide copper-plated gold-tin-preset heat sink structure is characterized by including the following steps:

placing the silicon carbide substrate into a magnetron sputtering platform, turning on the magnetron sputtering platform, sputtering a layer of metal titanium or titanium-tungsten alloy on one surface of the silicon carbide substrate and then sputtering a layer of metal copper by the magnetron sputtering platform as the seed layer, turning over the silicon carbide substrate after sputtering is finished, and sputtering a layer of metal titanium or titanium-tungsten alloy on the other surface of the silicon carbide substrate and then sputtering a layer of metal copper by the magnetron sputtering platform;

placing the silicon carbide substrate into an electrolytic bath filled with an electrolyte, and plating the two sides of the silicon carbide substrate with metallic copper in the electrolytic bath to form the first electroplated copper layer and the second electroplated copper layer;

placing the silicon carbide substrate into a photoetching machine, turning on the photoetching machine, locally exposing the silicon carbide substrate by the photoetching machine, and removing photoresist on the second electroplated copper layer through light shielding and development; and placing the silicon carbide substrate after photoetching into a vacuum coating machine, simultaneously placing two kinds of metal of gold and tin at double stations of the vacuum coating machine, simultaneously evaporating the two kinds of metal, and forming the preset gold-tin layer on the surface of the second electroplated copper layer by controlling evaporation speeds and times of the two kinds of metal.

By adopting the above technical solution, influences of a high temperature on materials and a circuit structure are avoided, and by adopting film and photoetching development technologies, the circuit structure on the substrate is finer, has excellent weldability and lead bonding assembly characteristics, and is suitable for precise electronic packaging; the copper electroplating mode does not excessively corrode the copper layer and is more beneficial to heat dissipation; the silicon carbide gold-tin-preset heat sink is obtained to meet requirements of the high-power laser chip for heat dissipation and assembly welding technologies of the heat sink.

Optionally, after the step of placing the silicon carbide substrate into an electrolytic bath filled with an electrolyte, and plating the two sides of the silicon carbide substrate with metallic copper in the electrolytic bath to form the first electroplated copper layer and the second electroplated copper layer, nickel and gold are electroplated on the surface of the second electroplated copper layer.

By adopting the above technical solution, by electroplating the nickel and the gold, the gold and the tin can be smoothly plated on the second electroplated copper layer to meet requirements for gold wire lead bonding.

Optionally, before the step of placing the silicon carbide substrate into a magnetron sputtering platform, turning on the magnetron sputtering platform, sputtering a layer of metal titanium or titanium-tungsten alloy on one surface of the silicon carbide substrate and then sputtering a layer of metal copper by the magnetron sputtering platform as the seed layer, turning over the silicon carbide substrate after sputtering is finished, and sputtering a layer of metal titanium or titanium-tungsten alloy on the other surface of the silicon carbide substrate and then sputtering a layer of metal copper by the magnetron sputtering platform, the magnetron sputtering platform is turned on, and the magnetron sputtering platform is detected to ensure that the magnetron sputtering platform can run normally.

By adopting the above technical solution, the magnetron sputtering platform is detected before running, thus improving technology safety and efficiency and avoiding that a processing efficiency is influenced by faults in running.

Optionally, before the step of placing the silicon carbide substrate into a magnetron sputtering platform, turning on the magnetron sputtering platform, sputtering a layer of metal titanium or titanium-tungsten alloy on one surface of the silicon carbide substrate and then sputtering a layer of metal copper by the magnetron sputtering platform as the seed layer, turning over the silicon carbide substrate after sputtering is finished, and sputtering a layer of metal titanium or titanium-tungsten alloy on the other surface of the silicon carbide substrate and then sputtering a layer of metal copper by the magnetron sputtering platform, the surface of the silicon carbide substrate is cleaned to ensure that no impurity exists on the surface of the silicon carbide substrate.

By adopting the above technical solution, it is avoided that impurities are mixed during magnetron sputtering to influence product quality, thus affecting a heat conduction efficiency and then influencing a heat dissipation efficiency.

Optionally, after the step of placing the silicon carbide substrate into an electrolytic bath filled with an electrolyte, and plating the two sides of the silicon carbide substrate with metallic copper in the electrolytic bath, the metal copper on the silicon carbide substrate is ground and polished.

By adopting the above technical solution, the surfaces of the first electroplated copper layer and the second electroplated copper layer are polished to reach required surface quality, such that surface roughness Ra is less than 0.05 m.

The present application has the following beneficial effects: the present application provides the silicon carbide copper-plated gold-tin-preset heat sink structure and the fabrication method thereof, the copper-silicon carbide-copper structure in the silicon carbide copper-plated gold-tin-preset heat sink structure has a good heat conduction effect; the width of the first electroplated copper layer is smaller than the width of the second electroplated copper layer, such that scattering of the emitted light is not affected when the chip is made at the edge of the second electroplated copper layer, thus guaranteeing the power of the chip; the structure is simple, the copper layer is not excessively corroded, and the heat dissipation is better facilitated; the silicon carbide gold-tin-preset heat sink is obtained to meet the requirements of the high-power laser chip for the heat dissipation and assembly welding technologies of the heat sink.

BRIEF DESCRIPTION OF THE DRAWINGS

For the purpose of describing the technical solutions of the embodiments of the present application more clearly, the following briefly describes the accompanying drawings required for describing the embodiments. Obviously, the accompanying drawings in the following description merely show some embodiments of the present application, and a person of ordinary skill in the art may still derive other drawings from these accompanying drawings without paying creative labors. In the drawings.

DETAILED DESCRIPTION

Figure 1:
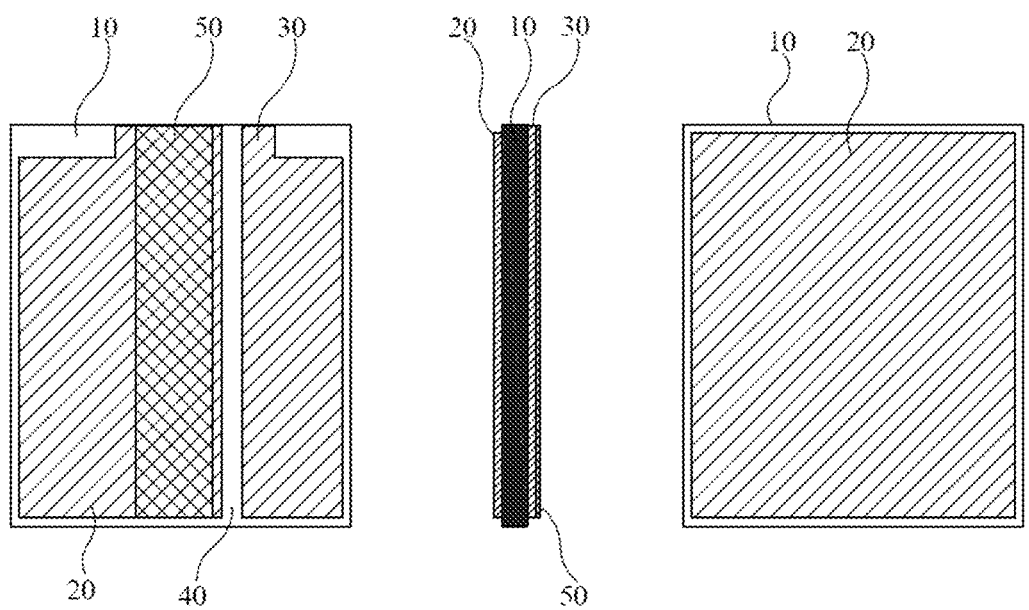
FIG. 1 is a schematic diagram of a silicon carbide copper-plated gold-tin-preset heat sink structure according to an embodiment of the present application.

The technical solutions in the embodiments of the present application are clearly and completely described with reference to the accompanying drawings in the embodiments of the present application, and apparently, the described embodiments are not all but only a part of the embodiments of the present application. All other embodiments obtained by a person of ordinary skill in the art based on the embodiments of the present application without creative efforts shall fall within the protection scope of the present application.

It should be noted that, if directional indications (such as up, down, left, right, front, rear . . . ) are involved in the embodiment of the present application, the directional indications are only used for explaining the relative positional relationship, movement, or the like, between the components in a certain specified posture (as shown in the drawing), and if the specified posture is changed, the directional indication is changed accordingly.

In addition, if there is a description relating to "first", "second", or the like, in the embodiment of the present application, the description of "first", "second", or the like, is for descriptive purposes only and is not to be construed as indicating or implying relative importance or implicitly indicating the number of indicated technical features. Thus, the feature defined with "first" and "second" may include at least one of this feature explicitly or implicitly. In addition, technical solutions of the embodiments may be combined with each other, but the combination must be based on realization by a person skilled in the art, and when a combination has contradictory technical solutions or cannot be realized, it should be considered that such a combination of technical solutions does not exist and is not within the protection scope of the present application.

In the present embodiment, in order to solve the problems of increased power of a laser chip and insufficient heat conductivity of aluminum nitride, a new structure is designed. A ceramic substrate is made of silicon carbide which has high heat conductivity, and the heat conductivity is larger than or equal to 390 W/(m·K), much larger than 200/(m·K) of aluminum nitride, almost the same as heat conductivity of copper of 399 W/(m·K). In a conventional copper-clad structure, a high temperature is required to sinter copper foil on a surface of the substrate, and then, a required circuit pattern is etched using a wet method. The high temperature during sintering in the process reduces a performance of materials, and when thick copper is etched using the wet method, a bottom of a copper layer is excessively corroded by etching liquid in a long-time etching process, and heat dissipation is adversely affected when a side surface of the copper is not vertical. In the present heat sink structure, copper layers are electroplated on surfaces of two sides of the silicon carbide substrate 10 by adopting a direct plating copper (DPC) technology to form copper-silicon carbide-copper structures, and the silicon carbide has the characteristics of high temperature resistance, corrosion resistance, high stability, or the like, thus obtaining higher power density and optimizing heat dissipation.

As shown in FIG. 1, the present application provides a silicon carbide copper-plated gold-tin-preset heat sink structure and a fabrication method thereof, and the silicon carbide copper-plated gold-tin-preset heat sink structure includes a silicon carbide substrate 10, a first copper plate (for example, a first electroplated copper layer 20), a second copper plate (for example, a second electroplated copper layer 30) and a preset gold-tin layer 50, wherein the first electroplated copper layer 20 is provided on a back side of the silicon carbide substrate 10, the second electroplated copper layer 30 is provided on a front side of the silicon carbide substrate 10, a thickness of the silicon carbide substrate 10 is larger than thicknesses of the first electroplated copper layer 20 and the second electroplated copper layer 30, a width of the silicon carbide substrate 10 is larger than widths of the first electroplated copper layer 20 and the second electroplated copper layer 30, the thickness of the first electroplated copper layer 20 is the same as the thickness of the second electroplated copper layer 30, the width of the first electroplated copper layer 20 is smaller than the width of the second electroplated copper layer 30, the preset gold-tin layer 50 is provided on an outer side of the second electroplated copper layer 30, and a width of the preset gold-tin layer 50 is the same as the width of the second electroplated copper layer 30.

The copper layers are electroplated on surfaces of two sides of a ceramic substrate to form a copper-silicon carbide-copper structure. The ceramic substrate is the silicon carbide substrate 10, silicon carbide is a third-generation semiconductor material and has high temperature resistance, corrosion resistance, high stability and high heat conductivity, the heat conductivity of the silicon carbide is larger than 390 W/(m·K) and quite close to heat conductivity (about 397 W/(m·K)) of copper, and a good heat conduction effect is achieved; the width of the first electroplated copper layer 20 is smaller than the width of the second electroplated copper layer 30, such that scattering of emitted light is not affected when the chip is made at an edge of the second electroplated copper layer 30, thus guaranteeing the power of the chip; the silicon carbide gold-tin-preset heat sink is obtained to meet requirements of the high-power laser chip for heat dissipation and assembly welding technologies of the heat sink.

Further, the silicon carbide copper-plated gold-tin-preset heat sink structure includes seed layers, the seed layers are provided on the front side and the back side of the silicon carbide substrate 10, the seed layers are provided between the first electroplated copper layer 20 and the silicon carbide substrate 10 and between the second electroplated copper layer 30 and the silicon carbide substrate 10 respectively, and the seed layers have a titanium copper or titanium tungsten alloy copper metallization layer structure; the seed layers are provided on the two sides of the silicon carbide substrate 10, such that the first electroplated copper layer 20 and the second electroplated copper layer 30 can be electroplated onto the silicon carbide substrate 10, and a bearing transition effect is achieved; titanium copper or titanium tungsten alloy copper metallization layers are attached to the front side and the back side of the silicon carbide substrate 10 and combined with the first electroplated copper layer 20 and the second electroplated copper layer 30, such that the copper can be conveniently plated on the silicon carbide substrate 10; titanium or titanium tungsten alloy has high strength, corrosion resistance and high temperature stability, such that an overall structure is stable.

In the present embodiment, an alloy proportion of the preset gold-tin layer 50 is Au (77±3%) Sn or Au (75±5%) Sn. A whole heat dissipation effect is good, and the requirements of the high-power laser chip for the heat dissipation and assembly welding technologies of the heat sink are met.

In the present embodiment, the thickness of the silicon carbide substrate 10 is 0.3 mm to 0.6 mm, and the thicknesses of the first electroplated copper layer 20 and the second electroplated copper layer 30 are 0.002 mm to 0.09 mm; the overall structure is stable, the heat conduction effect is good, and heat dissipation of the chip is facilitated.

In the present embodiment, a circuit layer 40 is provided on the second electroplated copper layer 30, and the circuit layer 40 is connected with the second electroplated copper layer 30 and the chip, such that the chip is electrically connected with the copper plate.

Figure 2:
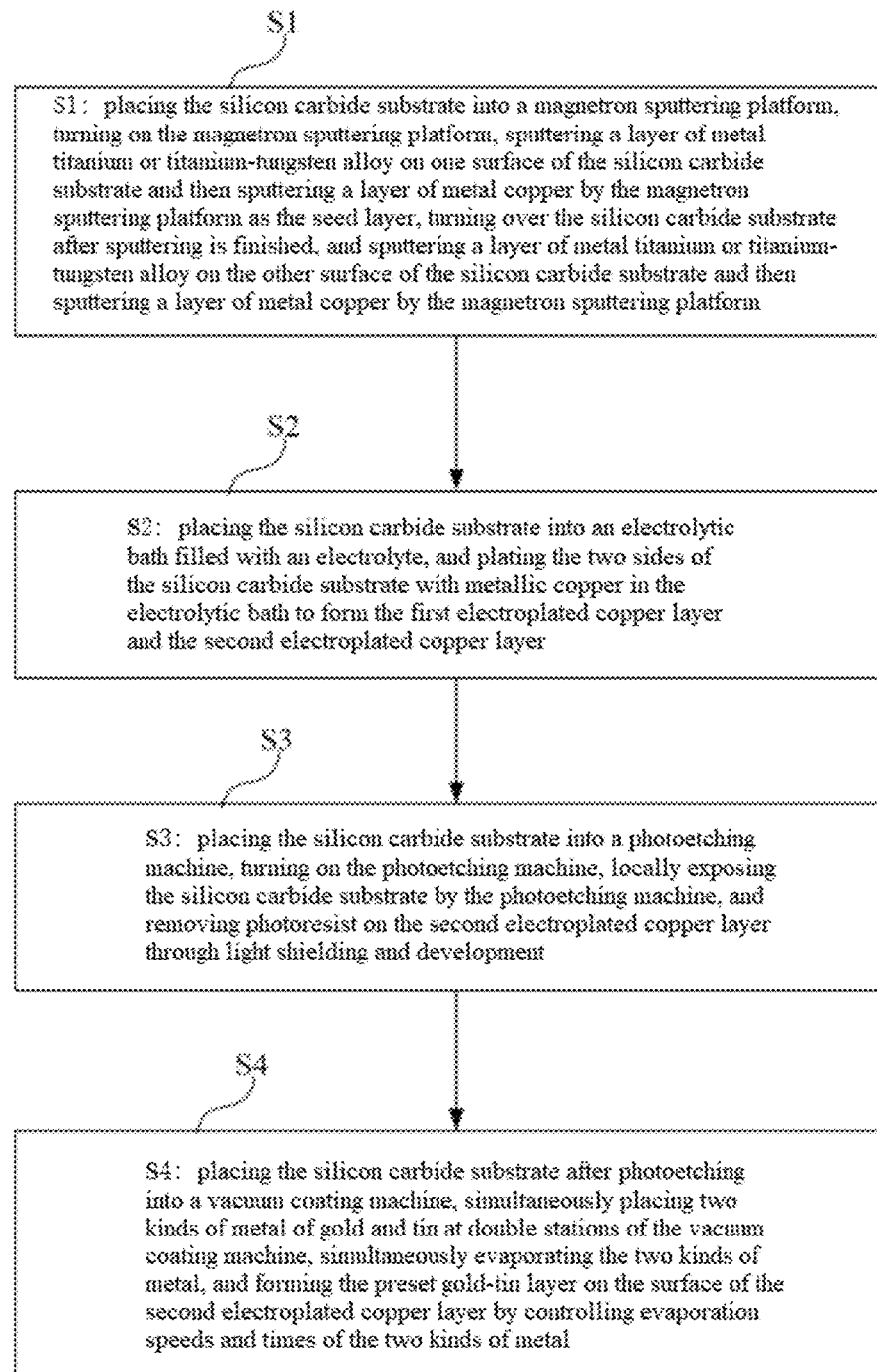
FIG. 2 is a flow chart of a fabrication method of the silicon carbide copper-plated gold-tin-preset heat sink structure according to an embodiment of the present application.

As shown in FIG. 2, a fabrication method of the silicon carbide copper-plated gold-tin-preset heat sink structure includes the following steps:

S1: placing the silicon carbide substrate 10 into a magnetron sputtering platform, turning on the magnetron sputtering platform, sputtering a layer of metal titanium or titanium-tungsten alloy on one surface of the silicon carbide substrate 10 and then sputtering a layer of metal copper by the magnetron sputtering platform as the seed layer, turning over the silicon carbide substrate 10 after sputtering is finished, and sputtering a layer of metal titanium or titanium-tungsten alloy on the other surface of the silicon carbide substrate 10 and then sputtering a layer of metal copper by the magnetron sputtering platform;

S2: placing the silicon carbide substrate 10 into an electrolytic bath filled with an electrolyte, and plating the two sides of the silicon carbide substrate 10 with metallic copper in the electrolytic bath to form the first electroplated copper layer 20 and the second electroplated copper layer 30;

S3: placing the silicon carbide substrate 10 into a photoetching machine, turning on the photoetching machine, locally exposing the silicon carbide substrate 10 by the photoetching machine, and removing photoresist on the second electroplated copper layer 30 through light shielding and development; and S4: placing the silicon carbide substrate 10 after photoetching into a vacuum coating machine, simultaneously placing two kinds of metal of gold and tin at double stations of the vacuum coating machine, simultaneously evaporating the two kinds of metal, and forming the preset gold-tin layer 50 on the surface of the second electroplated copper layer 30 by controlling evaporation speeds and times of the two kinds of metal.

Influences of a high temperature on materials and a circuit structure are avoided, and by adopting film and photoetching development technologies, the circuit structure on the substrate is finer, has excellent weldability and lead bonding assembly characteristics, and is suitable for precise electronic packaging; the copper electroplating mode does not excessively corrode the copper layer and is more beneficial to heat dissipation; the silicon carbide gold-tin-preset heat sink is obtained to meet requirements of the high-power laser chip for heat dissipation and assembly welding technologies of the heat sink.

After the step of placing the silicon carbide substrate 10 into an electrolytic bath filled with an electrolyte, and plating the two sides of the silicon carbide substrate 10 with metallic copper in the electrolytic bath to form the first electroplated copper layer 20 and the second electroplated copper layer 30, nickel and gold are electroplated on the surface of the second electroplated copper layer 30; by electroplating the nickel and the gold, the gold and the tin can be smoothly plated on the second electroplated copper layer 30 to meet requirements for gold wire lead bonding.

Before the step of placing the silicon carbide substrate 10 into a magnetron sputtering platform, turning on the magnetron sputtering platform, sputtering a layer of metal titanium or titanium-tungsten alloy on one surface of the silicon carbide substrate 10 and then sputtering a layer of metal copper by the magnetron sputtering platform as the seed layer, turning over the silicon carbide substrate 10 after sputtering is finished, and sputtering a layer of metal titanium or titanium-tungsten alloy on the other surface of the silicon carbide substrate 10 and then sputtering a layer of metal copper by the magnetron sputtering platform, the magnetron sputtering platform is turned on, and the magnetron sputtering platform is detected to ensure that the magnetron sputtering platform can run normally; the magnetron sputtering platform is detected before running, thus improving technology safety and efficiency and avoiding that a processing efficiency is influenced by faults in running.

Before the step of placing the silicon carbide substrate 10 into a magnetron sputtering platform, turning on the magnetron sputtering platform, sputtering a layer of metal titanium or titanium-tungsten alloy on one surface of the silicon carbide substrate 10 and then sputtering a layer of metal copper by the magnetron sputtering platform as the seed layer, turning over the silicon carbide substrate 10 after sputtering is finished, and sputtering a layer of metal titanium or titanium-tungsten alloy on the other surface of the silicon carbide substrate 10 and then sputtering a layer of metal copper by the magnetron sputtering platform, the surface of the silicon carbide substrate 10 is cleaned to ensure that no impurity exists on the surface of the silicon carbide substrate 10; it is avoided that impurities are mixed during magnetron sputtering to influence product quality, thus affecting a heat conduction efficiency and then influencing a heat dissipation efficiency.

After the step of placing the silicon carbide substrate 10 into an electrolytic bath filled with an electrolyte, and plating the two sides of the silicon carbide substrate 10 with metallic copper in the electrolytic bath, the metal copper on the silicon carbide substrate 10 is ground and polished; the surfaces of the first electroplated copper layer 20 and the second electroplated copper layer 30 are polished to reach required surface quality, such that surface roughness Ra is less than 0.05 km.

In conclusion, those skilled in the art can easily understand that the present application provides the silicon carbide copper-plated gold-tin-preset heat sink structure and the fabrication method thereof, the copper-silicon carbide-copper structure in the silicon carbide copper-plated gold-tin-preset heat sink structure has a good heat conduction effect; the width of the first electroplated copper layer 20 is smaller than the width of the second electroplated copper layer 30, such that scattering of the emitted light is not affected when the chip is made at the edge of the second electroplated copper layer 30, thus guaranteeing the power of the chip; the structure is simple, the copper layer is not excessively corroded, and the heat dissipation is better facilitated; By adopting the DPC technology, influences of a high temperature on materials and a circuit structure are avoided, and by adopting film and photoetching development technologies, the circuit structure on the substrate is finer, has excellent weldability and lead bonding assembly characteristics, and is suitable for precise electronic packaging; the copper electroplating mode does not excessively corrode the copper layer and is more beneficial to heat dissipation; the silicon carbide gold-tin-preset heat sink meets requirements of the high-power laser chip for heat dissipation and assembly welding technologies of the heat sink.

The above embodiments of the present application are merely examples for clearly illustrating the present application and are not intended to limit the embodiments of the present application. Other variations or modifications in different forms may be made by those skilled in the art on the basis of the above description. It is unnecessary and impossible to list all the embodiments here. Any modification, equivalent replacement, or improvement made within the spirit and principle of the present application shall be included in the protection scope of the present application.

LISTING OF REFERENCE SIGNS

10. Silicon Carbide Substrate
20. First Electroplated Copper Layer
30. Second Electroplated Copper Layer
40. Circuit Layer
50. Preset Gold-Tin Layer

What is claimed is:

1. A silicon carbide copper-plated gold-tin-preset heat sink structure, comprising a silicon carbide substrate, a first copper plate, a second copper plate and a preset gold-tin layer, wherein the first copper plate is provided on a back side of the silicon carbide substrate, the second copper plate is provided on a front side of the silicon carbide substrate, a thickness of the silicon carbide substrate is larger than thicknesses of the first copper plate and the second copper plate, a width of the silicon carbide substrate is larger than widths of the first copper plate and the second copper plate, the thickness of the first copper plate is the same as the thickness of the second copper plate, the width of the first copper plate is smaller than the width of the second copper plate, the first copper plate and the second copper plate are aligned at one end in a width direction, the preset gold-tin layer is provided on an outer side of the second copper plate, a width of the preset gold-tin layer is the same as the width of the second copper plate, and the preset gold-tin layer is formed on a surface of the second copper plate;

wherein the thickness of the silicon carbide substrate is 0.3 mm to 0.6 mm, and the thicknesses of the first copper plate and the second copper plate are 0.002 mm to 0.09 mm.

2. The silicon carbide copper-plated gold-tin-preset heat sink structure according to claim 1, wherein the silicon carbide copper-plated gold-tin-preset heat sink structure comprises a seed layer, the seed layer is provided on the front side and the back side of the silicon carbide substrate, respectively, the seed layer is provided between the first copper plate and the silicon carbide substrate and between the second copper plate and the silicon carbide substrate, respectively, and the seed layer has a titanium copper or titanium tungsten alloy copper metallization layer structure.

3. The silicon carbide copper-plated gold-tin-preset heat sink structure according to claim 1, wherein an alloy proportion of the preset gold-tin layer is Au (77±3%) Sn or Au (75±5%) Sn.

4. The silicon carbide copper-plated gold-tin-preset heat sink structure according to claim 1, wherein a circuit layer is provided on the second copper plate.

5. The silicon carbide copper-plated gold-tin-preset heat sink structure according to claim 1, wherein the first copper plate is a first electroplated copper layer.

6. The silicon carbide copper-plated gold-tin-preset heat sink structure according to claim 1, wherein the second copper plate is a second electroplated copper layer.

7. A fabrication method of the silicon carbide copper-plated gold-tin-preset heat sink structure according to claim 1, comprising the following steps:

placing the silicon carbide substrate into a magnetron sputtering platform, turning on the magnetron sputtering platform, sputtering a layer of metal titanium or titanium-tungsten alloy on a first surface of the silicon carbide substrate and then sputtering a layer of metal copper by the magnetron sputtering platform as a seed layer, turning over the silicon carbide substrate after sputtering is finished, and sputtering a second layer of metal titanium or titanium-tungsten alloy on a second surface of the silicon carbide substrate and then sputtering a second layer of metal copper by the magnetron sputtering platform;

placing the silicon carbide substrate into an electrolytic bath filled with an electrolyte, and plating the front side and the back side of the silicon carbide substrate with metallic copper in the electrolytic bath to form the first copper plate and the second copper plate;

placing the silicon carbide substrate into a photoetching machine, turning on the photoetching machine, locally exposing the silicon carbide substrate by the photoetching machine, and removing photoresist on the second copper plate through light shielding and development; and placing the silicon carbide substrate after photoetching into a vacuum coating machine, simultaneously placing two kinds of metal of gold and tin at double stations of the vacuum coating machine, simultaneously evaporating the two kinds of metal, and forming the preset gold-tin layer on a surface of the second copper plate by controlling evaporation speeds and times of the two kinds of metal.

8. The fabrication method of the silicon carbide copper-plated gold-tin-preset heat sink structure according to claim 7, wherein after the step of placing the silicon carbide substrate into an electrolytic bath filled with an electrolyte, and plating the front side and the back side of the silicon carbide substrate with metallic copper in the electrolytic bath to form the first copper plate and the second copper plate, nickel and gold are electroplated on the surface of the second copper plate.

9. The fabrication method of the silicon carbide copper-plated gold-tin-preset heat sink structure according to claim 7, wherein before the step of placing the silicon carbide substrate into a magnetron sputtering platform, turning on the magnetron sputtering platform, sputtering a layer of metal titanium or titanium-tungsten alloy on a first surface of the silicon carbide substrate and then sputtering a layer of metal copper by the magnetron sputtering platform as a seed layer, turning over the silicon carbide substrate after sputtering is finished, and sputtering a second layer of metal titanium or titanium-tungsten alloy on a second surface of the silicon carbide substrate and then sputtering a second layer of metal copper by the magnetron sputtering platform, the magnetron sputtering platform is turned on, and the magnetron sputtering platform is detected to ensure that the magnetron sputtering platform can run normally.

10. The fabrication method of the silicon carbide copper-plated gold-tin-preset heat sink structure according to claim 7, wherein before the step of placing the silicon carbide substrate into a magnetron sputtering platform, turning on the magnetron sputtering platform, sputtering a layer of metal titanium or titanium-tungsten alloy on a first surface of the silicon carbide substrate and then sputtering a layer of metal copper by the magnetron sputtering platform as a seed layer, turning over the silicon carbide substrate after sputtering is finished, and sputtering a second layer of metal titanium or titanium-tungsten alloy on a second surface of the silicon carbide substrate and then sputtering a second layer of metal copper by the magnetron sputtering platform, the first surface and the second surface of the silicon carbide substrate are cleaned to ensure that no impurity exists on the first surface and the second surface of the silicon carbide substrate.

11. The fabrication method of the silicon carbide copper-plated gold-tin-preset heat sink structure according to claim 8, wherein after the step of placing the silicon carbide substrate into an electrolytic bath filled with an electrolyte, and plating the front side and the back side of the silicon carbide substrate with metallic copper in the electrolytic bath, the metal copper on the silicon carbide substrate is ground and polished.

* * * * *